(12) United States Patent
Schwab

(10) Patent No.: US 6,229,201 B1
(45) Date of Patent: May 8, 2001

(54) INTEGRATED CIRCUIT HAVING A PARASITIC RESONANCE FILTER

(75) Inventor: Paul Schwab, Hudson, NH (US)

(73) Assignee: The Whitaker Corporation, Wilmington, DE (US)

( * ) Notice: Subject to any disclaimer, the term of this patent is extended or adjusted under 35 U.S.C. 154(b) by 0 days.

(21) Appl. No.: 09/136,857

(22) Filed: Aug. 20, 1998

Related U.S. Application Data

(63) Continuation-in-part of application No. 08/801,286, filed on Feb. 18, 1997, now Pat. No. 5,917,233.

(51) Int. Cl.[7] ............................... H01L 23/495
(52) U.S. Cl. ................. 257/666; 257/516; 257/723
(58) Field of Search .................... 257/666, 723, 257/924, 516

(56) References Cited

U.S. PATENT DOCUMENTS

| | | | |
|---|---|---|---|
| 5,220,298 | 6/1993 | Nagase | 333/185 |
| 5,495,125 | 2/1996 | Uemura | 257/666 |
| 5,635,751 | 6/1997 | Ikeda et al. | 257/584 |
| 5,811,880 | * 9/1998 | Banerjee et al. | 257/924 |
| 6,066,890 | * 5/2000 | Tsui et al. | 257/676 |

FOREIGN PATENT DOCUMENTS

| | | | |
|---|---|---|---|
| 3337796 A1 | 4/1985 | (DE) . | |
| 0595600A1 | 10/1993 | (EP) | H01L/23/66 |
| 63-15435 | * 1/1988 | (JP) | 257/924 |

OTHER PUBLICATIONS

Patent Abstracts of Japan, Application Date Aug. 26, 1991, Application No. 03213409.
PCT Search Report, dated Jul. 15, 1998, PCT/US 98/03290.
Wireless Systems Design; Theodore J. Kalinka and Thomas W. Baker; Mimimizing GSM Mobile–Terminal Design Risk Allows Easier Upgrades: dated May, 1996; pp. 54 and 55.

* cited by examiner

Primary Examiner—Roy Potter
(74) Attorney, Agent, or Firm—Synnestvedt & Lechner LI

(57) ABSTRACT

A packaged integrated circuit configured for interconnection to an external component comprises a die (1) having a high frequency contact (8), the die (1) being disposed on a lead frame (3). The lead frame (3) comprises a plurality of leads (9). At least two of the leads are first and second RF port leads (9a, 9b) which are electrically connected to the high frequency contact (8). When mounted to a printed circuit board substrate, there is a capacitor (12) connected between the first and second RF port leads (9a, 9b) to achieve frequency specific signal attenuation at an unwanted frequency with minimal contribution of insertion loss at a desired frequency.

15 Claims, 5 Drawing Sheets

INTEGRATED CIRCUIT HAVING A PARASITIC RESONANCE FILTER

This application is a CIP of Ser. No. 08/801,286, filed Feb. 18, 1997, now U.S. Pat. No. 5,917,233.

FIELD OF THE INVENTION

The present invention relates to integrated circuits and more particularly to a high frequency integrated circuit having filtered ports.

BACKGROUND OF THE INVENTION

High frequency systems, including radio frequency (RF) and microwave systems, generally comprise multiple high frequency integrated circuits (IC) and discrete devices interconnected on a printed circuit board. Typically, a high frequency system requires generation and amplification of a distortion free fundamental operating frequency. As a practical matter, high frequency components and systems often generate unwanted harmonics of the fundamental operating frequency through amplification and switching functions conventionally performed within the system. It is desirable to filter out these harmonics generated by the system so that the signal with which the system operates is as free of harmonic distortion as possible. A low harmonic distortion system generally exhibits better efficiency overall. In order to reduce harmonic distortion, it is conventional to filter out harmonics of the fundamental frequency at an RF output port on one or more of the ICs within the system. It is a matter of designer judgment at which IC or ICs to place the filter.

An article entitled "Minimizing GSM Mobile-Terminal Design Risk Allows Easier Upgrades" by Kalinka & Baker from the May 1996 publication of Wireless Systems Design magazine, shows conventional filtering of harmonic distortion at both the input of a power amplifier (PA) and the output of a low noise amplifier (LNA)/RF mixer in a GSM terminal. The filters shown by way of block diagram representation typically comprise from three to seven discrete elements or ceramic resonators soldered to the printed circuit board and connected to an RF port to the printed circuit board and connected to an RF port lead of the IC. Disadvantageously, these filters can be complex and generally consume a relatively large amount of usable surface area on the printed wiring board. Additionally these filters can contribute up to 1 dB of insertion loss to the system. In the case of a power amplifier IC used with conventional filtering, in order to achieve the desired system output power, the power amplifier must output sufficient power to supply the output power required by the system at the output stage of the filter in addition to the power lost due to the insertion loss of the filter. This additional output power requires more DC current be drawn by the power amplifier. The added DC current drain disadvantageously decreases efficiency and increases heat generation. Accordingly, the traditional filtering contributes to a larger, more complex, and less efficient system design which is in contravention of the interest to miniaturize and to extend battery life.

There is a need, therefore, for improved filtering in a high frequency system that does not adversely effect insertion loss, efficiency or miniaturization.

SUMMARY OF THE INVENTION

It is an object of the present invention to improve filtering in a high frequency system.

It is an object of the present invention to provide filtering for an IC without increasing insertion loss.

It is another object of the present invention to reduce external filter complexity.

It is another object of the present invention to reduce the printed circuit board surface area traditionally required for external filtering of high frequency ICs.

It is another object of the present invention to decrease the harmonic distortion present in a high frequency system.

An IC as a component part of a circuit comprises a die having a high frequency contact. A filter is electrically connected to the high frequency contact. The filter comprises a first inductive impedance electrically disposed in parallel with a second inductive impedance in series with a capacitive impedance. The first and second inductive impedances comprise first and second connecting elements between said die and said circuit.

It is an advantage of an IC according to the teachings of the present invention that an undesired signal may be filtered without adversely effecting insertion loss, efficiency, or miniaturization.

BRIEF DESCRIPTION OF THE DRAWINGS

Embodiments of the invention will now be described by way of example and in conjunction with the following figures in which.

DETAILED DESCRIPTION OF THE PREFERRED EMBODIMENTS

Figure 1:
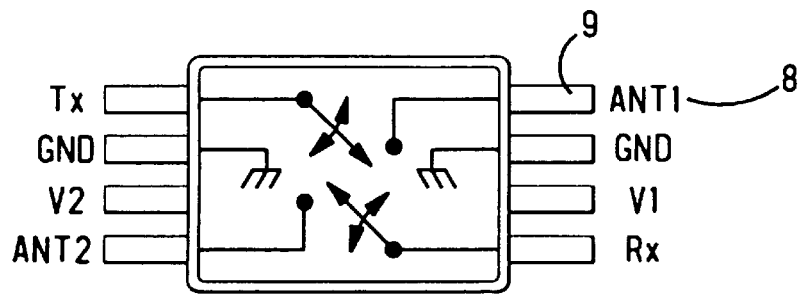
FIG. 1 is a functional schematic of a known transmit/receive diversity switch.
Figure 2:
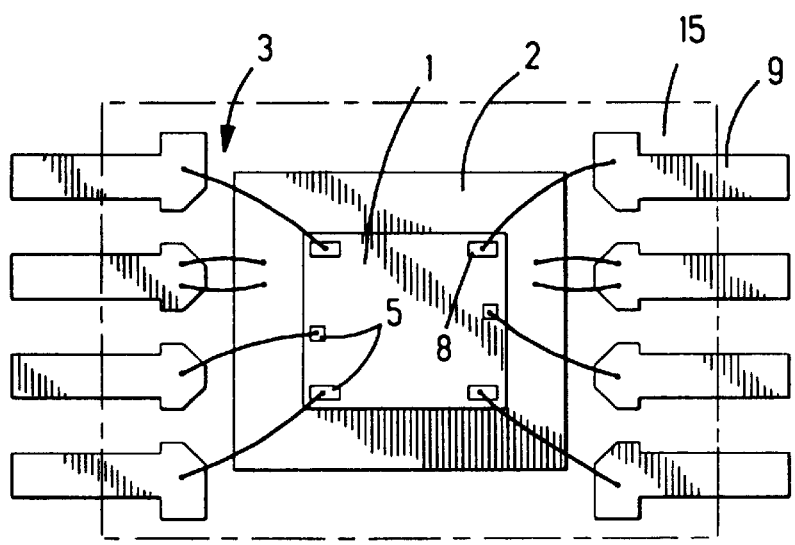
FIG. 2 is a known pinout of a packaged diversity switch.

For purposes of describing a preferred embodiment of the present invention, there is shown in the drawings an implementation of a GaAs based transmit/receive diversity switch according to the prior art and according to the teachings of the present invention. A functional schematic of a prior art transmit/receive diversity switch is shown in FIG. 1 of the drawings. As one of ordinary skill in the art can appreciate, the switch is made up of a symmetrical die (1). FIG. 2 of the drawings illustrates the prior art pin out of the diversity switch which shows the die (1) epoxied to a die attach paddle (2) of a SSOP-8 lead frame (3). The standard SSOP-8 lead frame (3) has a total of eight leads. A plastic body (5) molded around the lead frame (3), is shown in phantom line representation. A ceramic or glass package body (not shown) is also appropriate as are other types and sizes of lead frames including the MSOP,SOIC, TSSOP and SOT packages. The die (1) has contacts (5) thereon providing appropriate electrical access to and from the die (1). Each contact (5) is wire bonded according to conventional procedure to appropriate leads of the lead frame (3).

Figure 3:
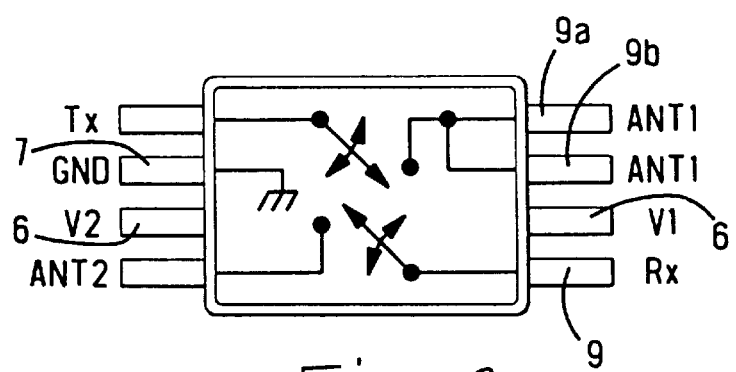
FIG. 3 is a functional schematic of a transmit receive diversity switch according to the teachings of the present invention.

The diversity switch packaged in an eight lead SSOP is shown configured for filtering a first RF port. In the prior art pin out, a high-frequency contact (8) provides access to an RF port and is interconnected to a single RF port lead (9). In an embodiment of the diversity switch according to the teachings of the present invention and with specific reference to FIGS. 3 and 4 of the drawings, adjacent high frequency contacts (8) are electrically identical and provide access to the RF port. Each high frequency contact is wirebonded adjacent leads (9a, 9b). The pin out further comprises two DC bias leads (6), one ground lead (7), and three RF ports having one lead (9) each. The specific wire bond configuration depends upon the number of leads available in the package, the number of DC biases and grounds necessary for the IC (1), and the desired filtering for the RF ports. In the embodiment shown in FIG. 4 of the drawings, the wire bond configuration deviates from the conventional configuration of each contact (5) wire bonded to a single lead, in that the RF output port to be filtered has two wire bonds (10a, 10b) electrically interconnecting a single high frequency signal contact (8) to two signal leads (9a, 9b). A first wire bond (10a) is connected to a first RF port lead (9a) and a second wire bond (10b) is connected to a second RF port lead (9b). In a less preferred embodiment, the IC presents the same RF port signal at two different high frequency contacts (8) on the die (1). In that case, each RF port lead 9a, 9b is electrically connected to a different signal contact carrying substantially the same signal. When the packaged IC is assembled and soldered to a printed wiring board substrate, each RF output port lead (9a, 9b) is electrically connected to a length of conductive trace, which at RF and microwave frequencies, behaves as a transmission line. First RF output port lead (9a) is connected to first trace (11a) and second RF output port lead (9b) is connected to second trace (11b) in known manner.

It is an object of the present invention to take advantage of the parasitic inductance already present in connecting elements comprising the wirebond (10a, 10b), lead (9a, 9b) and transmission line (11a, 11b) and use it to create a filtering circuit for use in conjunction with the IC (1).

Figure 5:
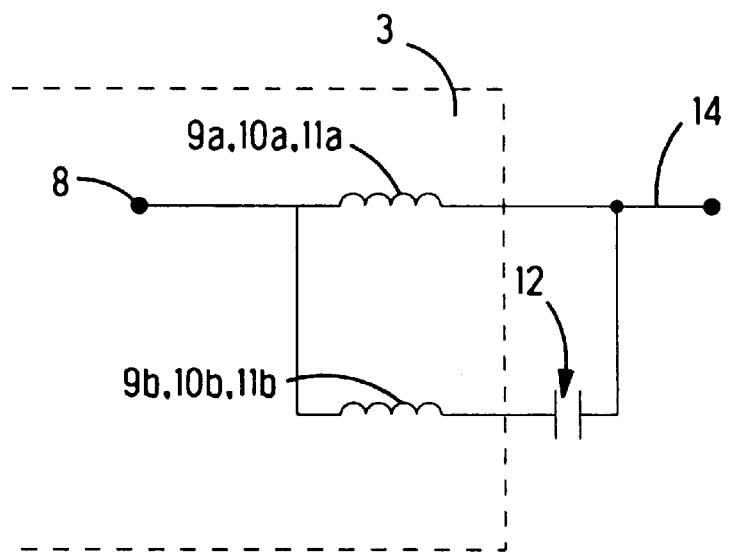
FIG. 5 is a schematic diagram of an equivalent circuit of a filter according to the teachings of the present invention.
Figure 6:
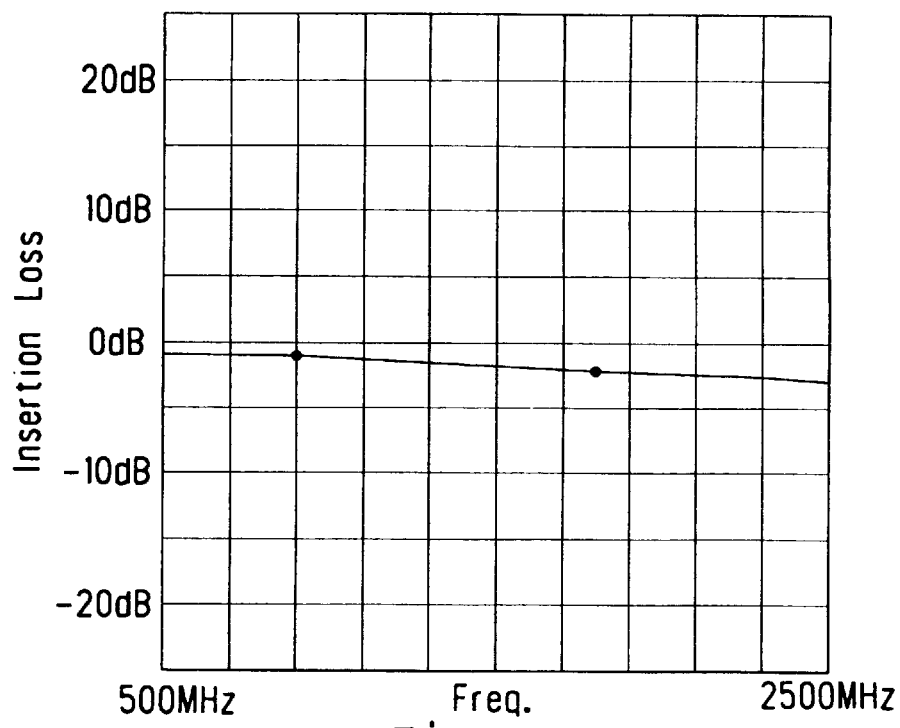
FIG. 6 is a graph of output power relative to input power versus frequency for an integrated circuit without filtering.

Pursuant to the objective, a capacitor (12) is connected between the first and second traces (11a, 11b). The parasitic inductance associated with each wire bond (10a, 10b), RF port lead (9a, 9b) and trace (11a, 11b) when interconnected with capacitor (12) creates a filter circuit. A lumped element equivalent circuit of the parasitic resonance filter circuit is shown in FIG. 5 of the drawings. This filter circuit is tuned by appropriate estimate or measurement of the inductance of the wire bond (10a), lead (9a), and trace (11a) and by appropriate selection of the value of the capacitor (12) to resonate at a desired frequency. Typically, the highest power unwanted spectral component of an RF/microwave system is the second harmonic of the fundamental operating frequency. Accordingly, for a 900 Mhz system, the capacitor (12) is selected to create a 1800 Mhz resonant circuit.

Each series combination of the wire bond (10a, 10b), the lead (9a, 9b), and the trace (11a, 11b) is equivalently represented as an inductor. As there are two similar combinations, each is represented by inductive values L1 and L2, respectively, having substantially equal value. The resonant frequency of the equivalent circuit occurs when the admittance (Y) of the filter circuit is zero. Accordingly, the admittance $Y_{L1}$ of the inductor (10a, 9a, 11a) represented by L1 when summed with the admittance ($Y_{L2}$,C) of the series inductor (10b, 9b, 11b) represented by L2 and parallel capacitor (12) represented by C must equal zero:

$$Y_{L1} + Y_{L2,C1} = 0$$

Representing the admittance in terms of frequency and inductance:

$$\frac{1}{j\omega L_1} + \frac{1}{j\omega L_2 + \frac{1}{j\omega C}} = 0$$

$$\frac{j\omega L_2 + \frac{1}{j\omega C}}{j\omega L_1} + 1 = 0$$

Because the value of $L_1$ equals $L_2$, the foregoing equation may be simplified by representing $L_1$ and $L_2$ with the single inductive value L where:

$$1 + \frac{\frac{1}{j\omega C}}{j\omega L} + 1 = 0$$

Solving for C:

$$\frac{1}{(j\omega C)(j\omega L)} = -2$$

$$\frac{1}{2\omega^2 CL} = 2$$

$$C = \frac{1}{2\omega^2 L} = \frac{1}{8\pi^2 f^2 L}$$

Where f is the 2nd harmonic frequency.

The appropriate selection of the value of capacitor (12) for a given frequency, therefore, is a function of the parasitic inductance (L1, L2). Advantageously, only a single external component is required for implementation of the parasitic resonance filter and the space within which the external capacitor physically fits is significantly less than the space required for implementation of traditional filtering having more lumped elements. Space minimization is of particular importance in portable applications. Also of importance is that the parasitic resonance filter does not contribute insertion loss to the system at the operating frequency.

In an SSOP-8 IC package, the inductance of the wire bond (10a, 10b), the lead (9a, 9b), and the trace (11a, 11b) may be approximated to be 3 nH. This assumes use of gold wire bonds of 1 mil diameter, and 200 mil 50 ohm traces connecting to the external capacitor (12). This also assumes that the packaged IC is mounted to a printed circuit board substrate according to Application Note Number M538 entitled "Surface Mounting Instructions published by M/A-COM, Inc. the contents of which are hereby incorporated by reference. For a 3 nH inductance, the appropriate value of the resonating capacitor (12) to create a parasitic filter that resonates at 1.8 Ghz is:

$$C = 1.3\,\mathrm{pF} = \frac{1}{8\pi^2(1.8\times 10^9)^2(3\times 10^{-9})}$$

Figure 7:
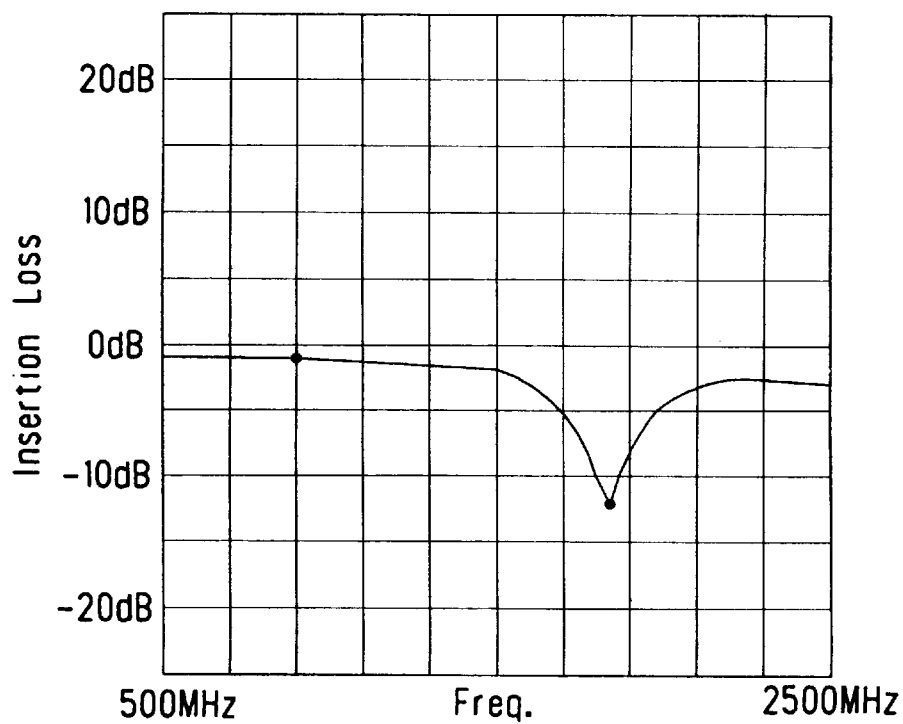
FIG. 7 is a graph of output power relative to input power at a filtered RF port of an integrated circuit having filtering according to the teachings of the present invention.

The performance of the known RF transmit/receive diversity switch without filtering is shown in FIG. 5 of the drawings. The insertion loss measurement was taken at the RF port lead. FIG. 7 of the drawings shows the performance of the same switch using a parasitic resonant filter according to the teachings of the present invention. The insertion loss measurement was taken at a filtered RF port (14). The particular filter implemented is designed to resonate at a second harmonic frequency of 1800 Mhz for a 900 Mhz system. As shown, there is minimal relative signal degradation at the desired fundamental operating frequency and a strong attenuation at the undesired second harmonic frequency. The sharp resonance seen at the second harmonic is the result of high Q factors of the parasitic inductors and the capacitor used to achieve the filtering. In this example, approximately 12 dB of rejection is achieved at the second harmonic frequency. Advantageously, signal degradation due to insertion loss is not increased by the addition of the capacitor (12). Because the package interconnects are inescapably present in any packaged IC mounted on a printed circuit board substrate and inasmuch as the parasitic inductances are inescapably present in the package, wirebonds and traces, filtering according to the teachings of the present invention contributes very little insertion loss at the fundamental operating frequency while performing the desirable function of second harmonic attenuation.

Filtering according to the teachings of the present invention is shown specifically for a diversity switch. The techniques of utilizing the wirebond, lead, and trace inductance, however, has significant advantages when utilized in conjunction with other high frequency ICs. As a specific example, a power amplifier integrated circuit having a filtered RF port according to the teachings of the present invention can be operated at a lower DC operating point. Consequently, there is less current drain than in the system which uses traditional filtering leading to lower operating temperatures and longer battery life.

Additionally, filtering according to the teachings of the present invention may also be implemented at RF input ports in order to filter undesired harmonics prior to operation on the signal by the IC and more than one filter according to the teachings of the present invention may be implemented on a single IC.

Figure 4:
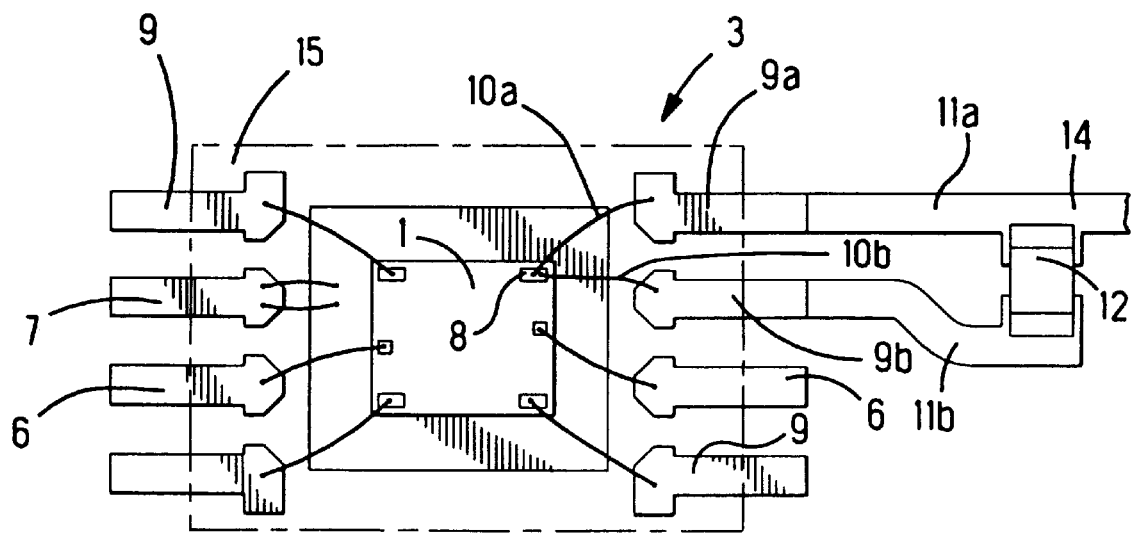
FIG. 4 is a pinout of a packaged diversity switch according to the teachings of the present invention.
Figure 8:
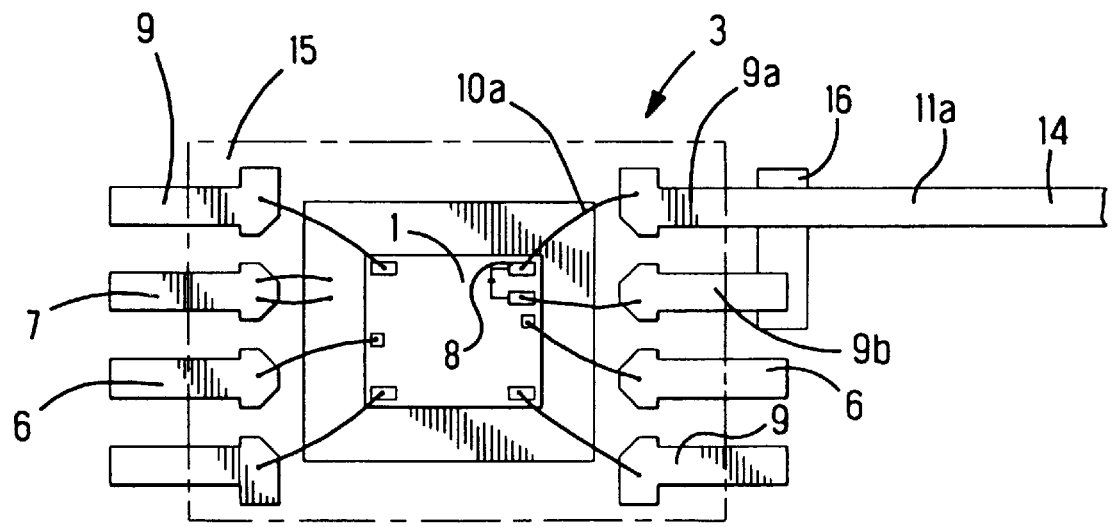
FIG. 8 is a pinout of an alternate embodiment of a packaged IC according to the teachings of the present invention.
Figure 9:
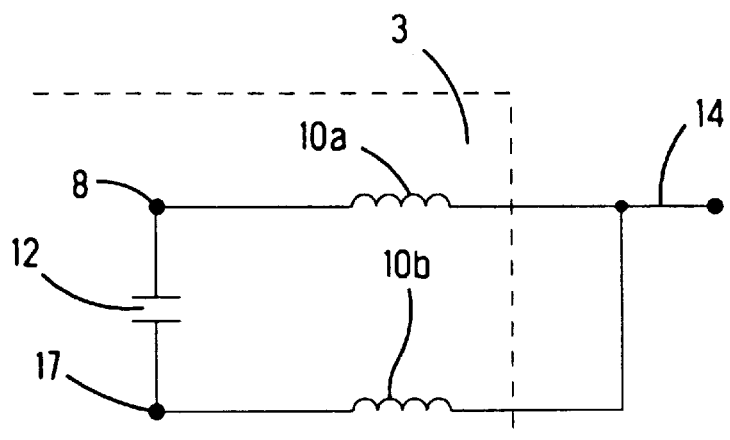
FIG. 9 is a schematic diagram of the equivalent circuit of the pinout shown in FIG. 8.

With specific reference to FIG. 8 of the drawings, there is shown a pinout diagram of an alternate embodiment of a packaged IC according to the teachings of the present invention in which the resonating capacitor (12) is implemented directly on the IC (1) in anticipation of the presence and value of the parasitic inductances that will be present in the packaged IC as incorporated in a final circuit. It is an intent to filter the ICs RF port by creating a filter circuit having an inductive path in parallel with a series capacitive-inductive combination. Connecting elements between the high frequency contact (8) and the filtered RF port (14) typically exhibit inductive impedances at high frequencies. It is the connecting elements, therefore, that act as the inductors of the filtering circuit as shown in the equivalent circuit illustrated in FIGS. 5 and 9. The connecting elements are defined as the electrically conductive elements that interconnect the IC (1) to an external circuit in which the IC (1) is a component part. The connecting elements, therefore, may be made up of the wirebond alone or the wirebond in series with either a lead, if present, or a length of trace, if present, or both. The value of the capacitor (12) is chosen to resonate in the filtering circuit having the parasitic inductances present in the IC connecting elements. As a specific example, each connecting element in the embodiment of FIG. 8 is interconnected to the high frequency contact (8) which provides electrical access to the RF port of the IC (1). In FIG. 8 of the drawings, each connecting element comprises the series combination of wirebond (10a or 10b), lead (9a or 9b), and portion of the trace (11a or 11b) that is intermediate the high frequency contact (8) and the filtered RF port (14). Ends of each connecting element distal from the IC (1) are electrically interconnected with an electrical short (16). A single trace extending from the short (16) comprises the filtered RF port (14) which may be routed to the external circuit as appropriate. A schematic representation of the equivalent circuit is shown in FIG. 9 of the drawings wherein the resonating capacitor (12) is electrically disposed in series with one of the connecting elements between the high frequency contact (8) providing access to the RF port and the filtered RF port (14). In a specific embodiment as shown in FIG. 8 of the drawings, the capacitor (12) is connected between the high frequency contact (8) and an intermediate contact (17) on the IC (1). The capacitor (12) is also electrically disposed in series with one of the connecting elements which in the embodiment of FIG. 8 comprises wirebond, lead, and trace (9b,10b,11b). Another one of the connecting elements comprises the other wirebond, lead, and trace (9a,10a,11a) and is electrically disposed in parallel with the series capacitor (12)/connecting element (9b,10b,11b) between the high frequency contact (8) and the filtered RF port (14). Ends of the connecting elements (9a,10a,11a) and (9b,10b,10c) distal from the IC (1) are interconnected with an electrical short (16) from which the filtered RF port (14) is made accessible to the external circuitry. Advantageously, there is no need to use an external capacitor, as shown in FIG. 4 of the drawings, to obtain the full benefits of the parasitic resonant filter according to the teachings of the present invention. Having the resonating capacitor (12) directly on the IC (1) saves valuable space or "real estate" on the printed circuit board (PCB) (not shown) to which the packaged IC (3) is a component part. There is a tradeoff in that when an IC manufacturer supplies the packaged IC, the value of the resonating capacitor (12) is fixed and may not be adjusted depending upon the specific operating frequency, the trace lengths employed and the resulting parasitic inductances.

Figure 10:
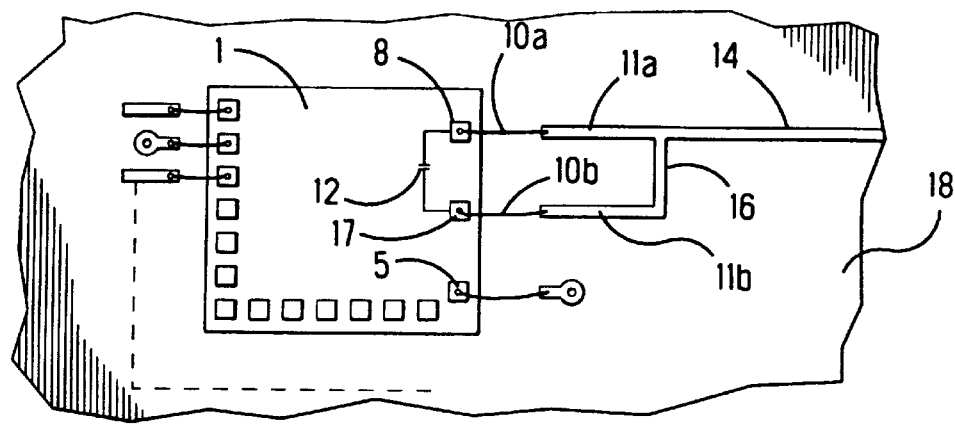
FIG. 10 shows a plan view of an IC mounted directly to a printed circuit board according to the teachings of the present invention.
Figure 11:
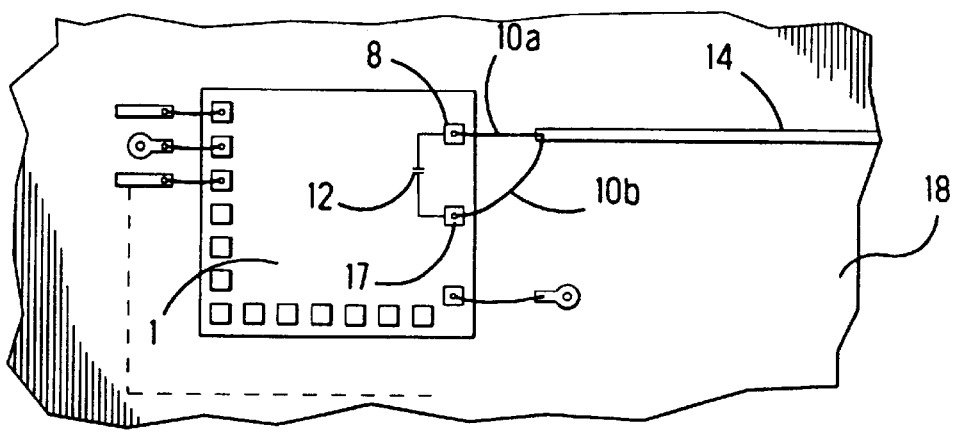
FIG. 11 shows an alternate embodiment of an IC mounted directly to a printed circuit board according to the teachings of the present invention.
Figure 12:
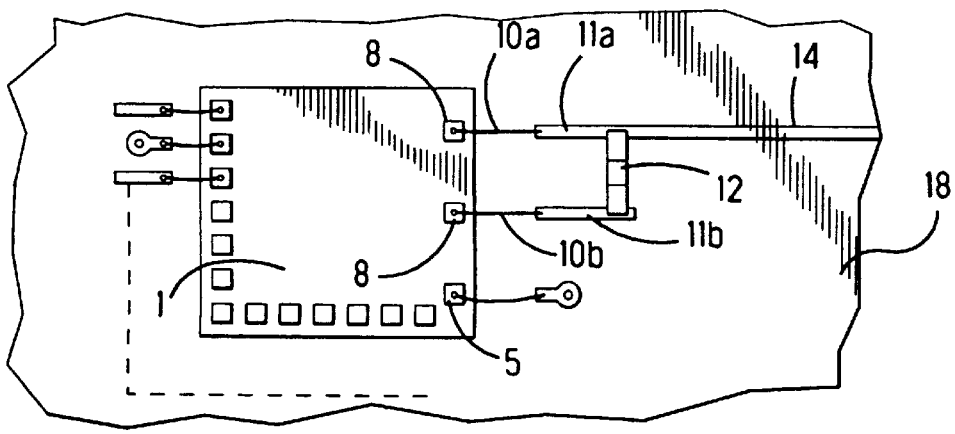
FIG. 12 shows an alternate embodiment of an IC mounted directly to a printed circuit board according to the teachings of the present invention.

With specific reference to FIGS. 10, 11, and 12 of the drawings, there is shown three embodiments of a parasitic resonant filter according to the teachings of the present invention which is appropriate for a chip on board device and for chip scale packaging. As with the packaged IC embodiment, the resonating capacitor (12) may be implemented either internal or external to the IC (1) as appropriate under the circumstances. The term "chip on board" device refers to a device or circuit that comprises one or more unpackaged ICs and may also include one or more discrete components that are mounted directly to a printed wiring board (PWB) substrate (18). The PWB (18) is typically a multilayer board having metallized traces, vias, and ground planes appropriate for a specific circuit employed on the PWB (18). In a final assembly, the chip on board device is typically leaded with either gull wing style leads or ball grid array style leads for eventual incorporation into a larger PCB (not shown) of which the chip on board device is a component part. If the resonating capacitor (12) is implemented external to the IC (1), it may take the form of a discrete monolithic capacitor or an area of the PWB (18) in which a capacitive element is implemented internal to the PWB (18). The directly mounted IC (1) is interconnected to the traces (11a, 11b) and to the rest of the circuit on the PWB substrate (18) through wirebonds (10a,10b) extending between the IC contacts and the metalized circuit traces on the PWB substrate (18). A polymer applied to the top of the bare die and wirebonds environmentally protects the component circuitry. The chip on board device obviates the need for packaging individual ICs and eliminates the lead frame and leads that add a significant amount of parasitic inductance to a circuit. The connecting elements, which in the embodiment of FIG. 10 comprise the series combination of the wirebonds (10a,10b) and the traces (11a,11b), however, still add a certain amount of parasitic inductance, although the value of the parasitic inductance is lower than in the packaged IC (3). The value of the resonating capacitor (12), therefore, is adjusted accordingly to create a resonant circuit with whatever inductances are present in the connecting elements and given the circuit schematic as shown the in drawings. In the embodiment shown in FIG. 10, the resonating capacitor (12) is implemented on the IC and is electrically disposed between the high frequency contact (8) which provides electrical access to the RF port and the intermediate contact (17). In a preferred embodiment, the RF port (8) on the IC is adjacent the intermediate contact (17) also on the IC (1). In the preferred embodiment, therefore, the length and constituent parts of the connecting elements are substantially similar. This similarity results in a substantially similar inductive value for each connecting element in the circuit. The ends of the connecting elements (10a,11a) and (10b,11b) distal from the IC (1) are electrically interconnected at a common point or short (16) which also comprises the filtered RF port (14).

An alternative and preferred embodiment, as shown in FIG. 11 of the drawings, comprises a die (1) having an internal resonating capacitor (12) electrically disposed between the high frequency contact (8) and the intermediate contact (17) and wherein the respective wirebonds (10a,10b) comprise the respective connecting elements. The resonating structure, therefore, is comprised of the resonating capacitor (12) internal to the die (1) and the parasitic inductance present in each of the respective wirebonds (10a,10b). The ends of the wirebonds (10a,10b) distal from the IC are connected to the same electrical point on the PWB (18). The point at which the distal ends of the wirebonds (10a,10b) are attached, therefore, becomes the filtered RF port (14). As one of ordinary skill will appreciate, the value of the resonating capacitor (12) is adjusted to the value of the parasitic inductance value present in the wirebonds (10a, 10b) alone. It is advantageous, although not necessary, for the high frequency contact (8) and the intermediate contact (17) to be adjacent each other in order to provide a structure resulting in wirebonds (10a,10b) having similar lengths. Advantageously, this embodiment uses up even less space than the other disclosed embodiments, and provides a similar level of filtering of the IC's RF port.

Alternatively, a chip on board embodiment may include the use of an external resonating capacitor (12) as shown in FIG. 12 of the drawings. In this embodiment, an IC die (1) comprises first and second high frequency contacts (8) providing access to a single RF port. The first and second high frequency contacts (8,8), therefore, are electrically identical and, in a preferred embodiment, are adjacent each other. The connecting elements for each respective high frequency contact (8) comprise the wirebond (10a or 10b) and the trace (11a or 11b). An external resonating capacitor (12) is electrically disposed between the respective ends of the connecting elements distal from the IC (1) and the filtered RF port (14) is accessible to the external circuit from one or the other end of the resonating capacitor (12).

Other advantages of the invention are apparent from the detailed description by way of example and from accompanying drawings, and from the spirit and scope of the appended claims.

What is claimed is:

1. A packaged integrated circuit comprising:
   an integrated circuit die having a high frequency contact and an intermediate contact, said integrated circuit die being disposed on a lead frame,
   a capacitor electrically disposed between said high frequency contact and said intermediate contact, and
   at least two connecting elements, one of said connecting elements interconnecting the said high frequency contact to a filtered RF port, and another one of said connecting elements interconnecting the intermediate contact to said filtered RF port.

2. A packaged IC as recited in claim 1 wherein an impedance of each said connecting element has an inductance value and a value of said capacitor is selected to create a resonate circuit with said impedance.

3. A packaged IC as recited in claim 1 wherein said connecting elements are adjacent each other.

4. A packaged IC as recited in claim 1 wherein said high frequency contact and said intermediate contact are adjacent each other.

5. A packaged IC as recited in claim 3 wherein said high frequency contact and said intermediate contact are adjacent each other.

6. A packaged IC as recited in claim 2 wherein said impedance is substantially the same for each connecting element.

7. An integrated circuit for use as a component of a circuit assembly comprising:
   a die having first and second high frequency contacts, each high frequency contact carrying substantially the same signal, at least two connecting elements, one of said connecting elements interconnecting said first high frequency contact to a filtered RF port, a capacitor having first and second contact points, said first contact point being interconnected to said filtered RF port, and another one of said connecting elements interconnecting said second contact point to said second RF port.

8. An integrated circuit for use as a component of a circuit assembly as recited in claim 7 wherein each said connecting element has an inductive impedance and a value of said capacitor is selected to resonate with said inductive impedance of said connecting elements.

9. An integrated circuit for use as a component of a circuit assembly as recited in claim 8 wherein the inductive impedance value of each said connecting element is substantially similar.

10. An integrated circuit for use as a component of a circuit assembly as recited in claim 9 wherein said first and second high frequency contacts are adjacent each other.

11. An integrated circuit comprising:
    an integrated circuit die having a high frequency contact and an intermediate contact, a capacitor electrically disposed between said high frequency contact and said intermediate contact, and at least two connecting elements, one of said connecting elements interconnecting the high frequency contact to a filtered RF port, and another one of said connecting elements interconnecting the intermediate contact to said filtered RF port.

12. An IC as recited in claim 11 wherein an impedance of each said connecting element has an inductance value and a value of said capacitor is selected to create a resonant circuit with said impedances of said connecting elements.

13. A packaged IC as recited in claim 11 wherein said connecting elements are adjacent each other.

14. A packaged IC as recited in claim 11 wherein said high frequency contact and said intermediate contact are adjacent each other.

15. A packaged IC as recited in claim 13 wherein said high frequency contact and said intermediate contact are adjacent each other.

* * * * *